(12) United States Patent
Ishikawa et al.

(10) Patent No.: US 6,449,307 B1
(45) Date of Patent: Sep. 10, 2002

(54) APPARATUS FOR MEASURING ELECTRICAL CHARACTERISTICS OF CIRCUIT

(75) Inventors: Yohei Ishikawa, Kyoto; Hiroaki Tanaka, Osaka-fu; Tetsuya Kochi, Mukou, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/325,145

(22) Filed: Jun. 3, 1999

(30) Foreign Application Priority Data

Jun. 5, 1998 (JP) ............................................ 10-157727
Apr. 12, 1999 (JP) ............................................ 11-104360

(51) Int. Cl.$^7$ ................................................. H04B 3/46
(52) U.S. Cl. ....................... 375/146; 375/228; 370/241; 324/763
(58) Field of Search ................................. 375/130, 140, 375/141, 146, 147, 224–228; 455/67.1, 67.4, 115, 423; 370/252, 241; 324/763

(56) References Cited

U.S. PATENT DOCUMENTS 5,394,120 A * 2/1995 Sakamoto et al. .............. 330/2
6,233,437 B1 * 5/2001 Klenner ....................... 455/115

* cited by examiner

*Primary Examiner*—Amanda T. Le
(74) *Attorney, Agent, or Firm*—Ostrolenk, Faber, Gerb & Soffen, LLP

(57) ABSTRACT

A multi-carrier measuring apparatus includes a multi-carrier generator for generating a multi-carrier signal composed of signals having plural frequencies and being orthogonal to each other, an output for inputting the multi-carrier signals to a object at the same time, and receiving the multi-carrier signals reflected on or passed through the object, a frequency characteristic measuring apparatus for measuring the characteristics for the respective frequencies of the object based on the received signal, and an indicator.

10 Claims, 10 Drawing Sheets

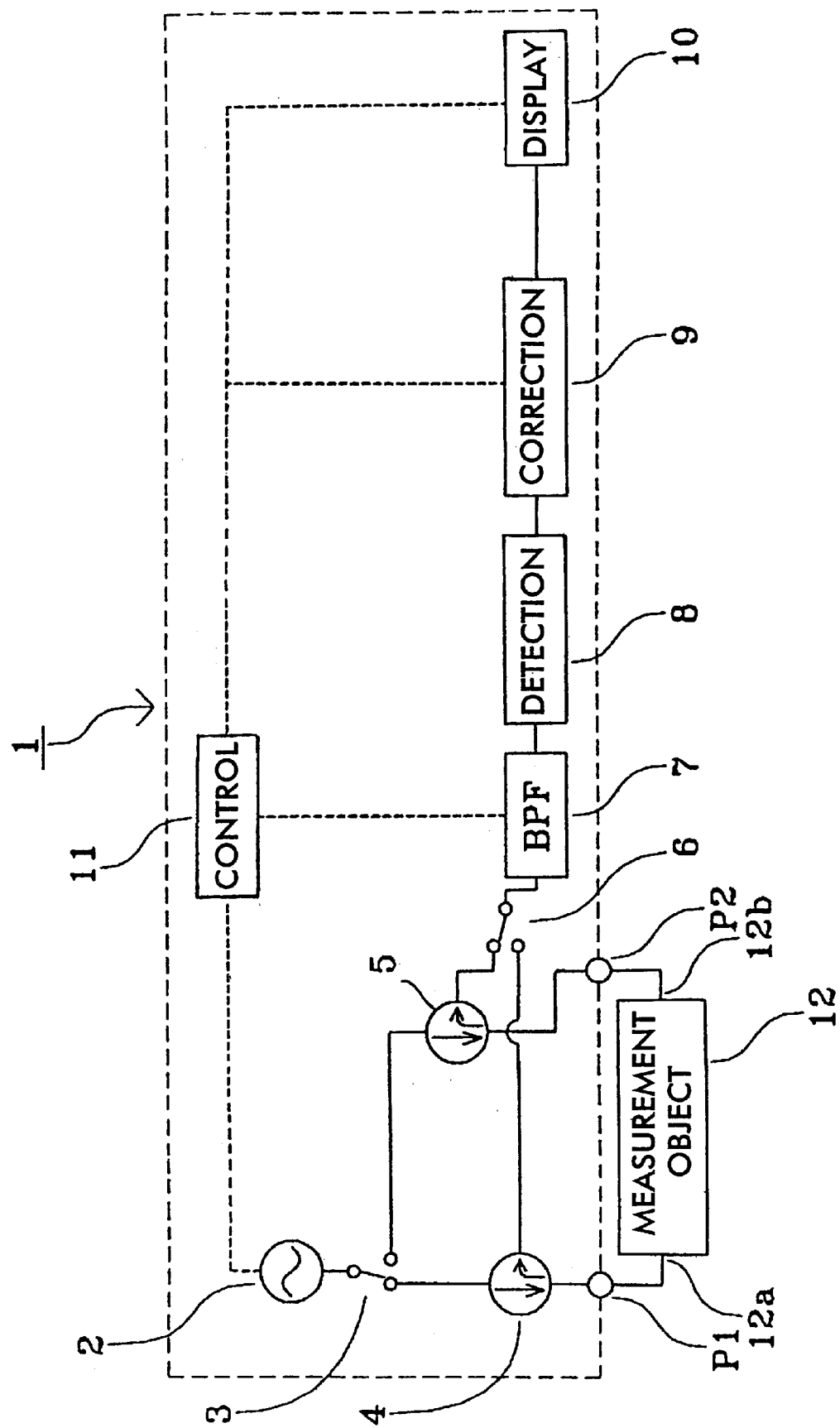

APPARATUS FOR MEASURING ELECTRICAL CHARACTERISTICS OF CIRCUIT

BACKGROUND OF THE INVENTION

1. Field of the Invention

The present invention relates to an apparatus for measuring the electrical characteristics of an electric circuit, and more particularly, to an apparatus for measuring the characteristics of an electric circuit applicable in a high frequency band, at a high speed.

2. Description of the Related Art

In recent years, higher frequencies have been employed for communication apparatuses. It has been more required to measure the frequency characteristics of an electronic component or a network of an electronic circuit at a high speed. Further, with the development of a spread spectrum communication system and the like, it has been more required to measure the frequency characteristics of an electronic component or an electronic circuit when signals having plural frequencies are input to the electronic component or the electronic circuit.

FIG. 12 is a block diagram of a conventional measuring apparatus. In FIG. 12, a measuring apparatus 1 is composed of a sweep signal generator 2, a one-input two-output switch 3, circulators 4 and 5, two-input one-output switch 6, a band pass filter 7, a signal detector 8, a corrector 9, an indicator 10, a controlling circuit 11, and signal ports P1 and P2. In this case, the output of the sweep signal generator 2 is connected to the switch 3. One output of the switch 3 is connected to the signal port P1 through the circulator 4. The other output of the switch 3 is connected to the signal port P2 through the circulator 5. Further, the circulator 4 is connected to one input of the switch 6. The circulator 5 is connected to the other input of the switch 6. The output of the switch 6 is connected to the indicator 10 through the band-pass filter 7, the signal detector 8, and the corrector 9 in that order. The controlling circuit 11 is connected to the sweep signal generator 2, the band-pass filter 7, the corrector 9, and the indicator 10. Outside the measuring apparatus 1, the signal port P1 is connected to the first terminal 12a of an external object 12, and the signal port P2 to the second terminal 12b of the object 12, respectively. In this case, the sweep signal generator 2 is so configured that its oscillation frequency can be swept in the order toward the higher frequency. The band-pass filter 7 is so configured that its pass-band can be changed in correspondence to the oscillation frequency of the sweeping signal generator 2 to make only the signal having the oscillation frequency form the sweep signal generator 2 to pass.

In the measuring apparatus 1 configured as described above, for example, if it is desired to measure the pass-characteristics (S21) ranging from the first terminal 12a of the object 12 to the second terminal 12b, the sweep signal generator 2 and the circulator 4 are connected by means of the switch 3, and the circulator 5 and the band-pass filter 7 are connected by means of the switch 6. The controlling circuit 11 causes the oscillation frequency of the sweep signal generator 2 to be swept in a predetermined frequency range in the order toward the higher frequency. The signal from the sweep signal generator 2, going through the switch 3 and the circulator 4, is output from the measuring apparatus 1 trough the signal port P1, and input to the object 12 through the first terminal 12a. The signal, passed through the object 12, is output through the second terminal 12b, and returned to the measuring apparatus 1 through the signal port P2. The signal returned to the measuring apparatus 1, through the circulator 5, the switch 6, and the band-pass filter 7 for passing only the signal having the oscillation frequency of the sweep signal generator 2, is input to the signal detector 8, where the amplitude and the phase are detected. The amplitude and the phase of the signal detected by the signal detector 8 is corrected by means of the corrector 9 using the calibration values determined previously in the state that the object 12 is absent and the signal ports P1 and P2 are directly connected, and displayed on the indicator 10.

As seen in the above description, the oscillation frequency of the sweep signal generator 2 is swept in the order toward the higher frequency, and detected, corrected, and displayed each sweeping cycle. Thus, the dependence of the pass-characteristics of the object 12 on the frequency are displayed on the indicator 10.

In the above example, described is the configuration of the measuring apparatus 1 by which the pass-characteristics ranging from the first terminal 12a to the second terminal 12b of the object 12 are measured. However, by combination of the switches 3 and 6, the configuration can be employed by which the pass-characteristics (S12) of the object 12 ranging from the second terminal 12b thereof to the first terminal 12a, or the reflection characteristics (S11 and S22) of the object 12 in the first terminal 12a and the second terminal 12b are measured.

However, in the measuring apparatus 1 shown in FIG. 12, it is indispensable to sweep the oscillation frequency of the sweep signal generator 2. Thus, for the sweeping, a time-period is required. Thus, there is the problem that as the band of frequencies for measurement is wider, or the measurement point number of the frequency is greater, the sweeping time is longer, that is, the measurement time is greater.

As regards the pass-characteristics and the reflection characteristics of the object such as S11 and S21, only one characteristic of the object can be measured at one time. Accordingly, the measurement needs to be repeated for the respective characteristics. It is troublesome that a still longer time-period is required for the measurement.

Further, the frequency characteristic can be measured only in the state that a signal having one frequency is input to the object at one time. Thus, caused is the problem that if signals having at least two frequencies are input to the object at the same time, the characteristics can not be measured.

SUMMARY OF THE INVENTION

The present invention provides a measuring apparatus by which plural characteristics at plural frequency can be measured at the same time, and moreover, non-linear characteristics given in the state that plural signals are input can be measured.

To achieve the above object, the measuring apparatus comprises a multi-carrier generator for generating a multi-carrier signal composed of signals having plural frequencies and being orthogonal to each other;

an output for sending the multi-carrier signal to an external object; an input for receiving the multi-carrier signal output from the object; and a frequency characteristic measuring apparatus for measuring the electrical characteristics at the respective frequencies of the object, based on the received multi-carrier signal.

Preferably, the multi-carrier generator is operative to generate plural multi-carrier signals which are orthogonal to each other.

The output may have plural ports for transmitting the plural multi-carrier signals to the object in parallel.

The input may have plural ports for receiving the plural multi-carrier signals. output from the object in parallel.

Preferably, the frequency characteristic measuring apparatus is operative to measure plural kinds of characteristics of the object based on the received plural multi-carrier signals.

Also preferably, the multi-carrier signals to be input to the object is swept in a predetermined frequency range.

Preferably, the multi-carrier generator comprises a signal generator for generating a signal having one frequency, a spread code generator for generating a predetermined spread code, and a spectrum spreader for spreading spectrally the signal generated by the signal generator with the spread code generated by the spread code generator, and the frequency characteristic measuring apparatus comprises plural filters corresponding to the frequencies of the respective signals contained in the received multi-carrier signal, and plural signal detectors for measuring the characteristics for the respective signals separated by the plural filters.

Also preferably, the multi-carrier generator comprises a signal generator for generating a signal having one frequency, a data generator for generating a predetermined datum, a modulator for modulating primarily the signal generated by the signal generator with the predetermined datum to form a signal which changes time-dependently in correspondence to the predetermined datum, and a time—frequency converter for converting the modulated signal time-dependently to form a multi-carrier signal composed of signals having plural frequencies, said signals being related principally to the predetermined datum, and, the frequency characteristic measuring apparatus comprises a frequency time converter for frequency—time converting the received multi-carrier signal, and a signal detector for detecting the difference between the modulated signal and the frequency—time converted signal, correspondingly to the predetermined datum.

With the above-described configuration, according to the measuring apparatus of the present invention, the plural characteristics at plural frequencies of a measurement object can be measured at the same time, and moreover, the characteristics can be measured in the state that the plural signals are input to the object at the same time.

BRIEF DESCRIPTION OF THE DRAWINGS

FIG. 12 is a block diagram of a conventional measuring apparatus.

DESCRIPTION OF THE PREFERRED EMBODIMENT

Figure 1:
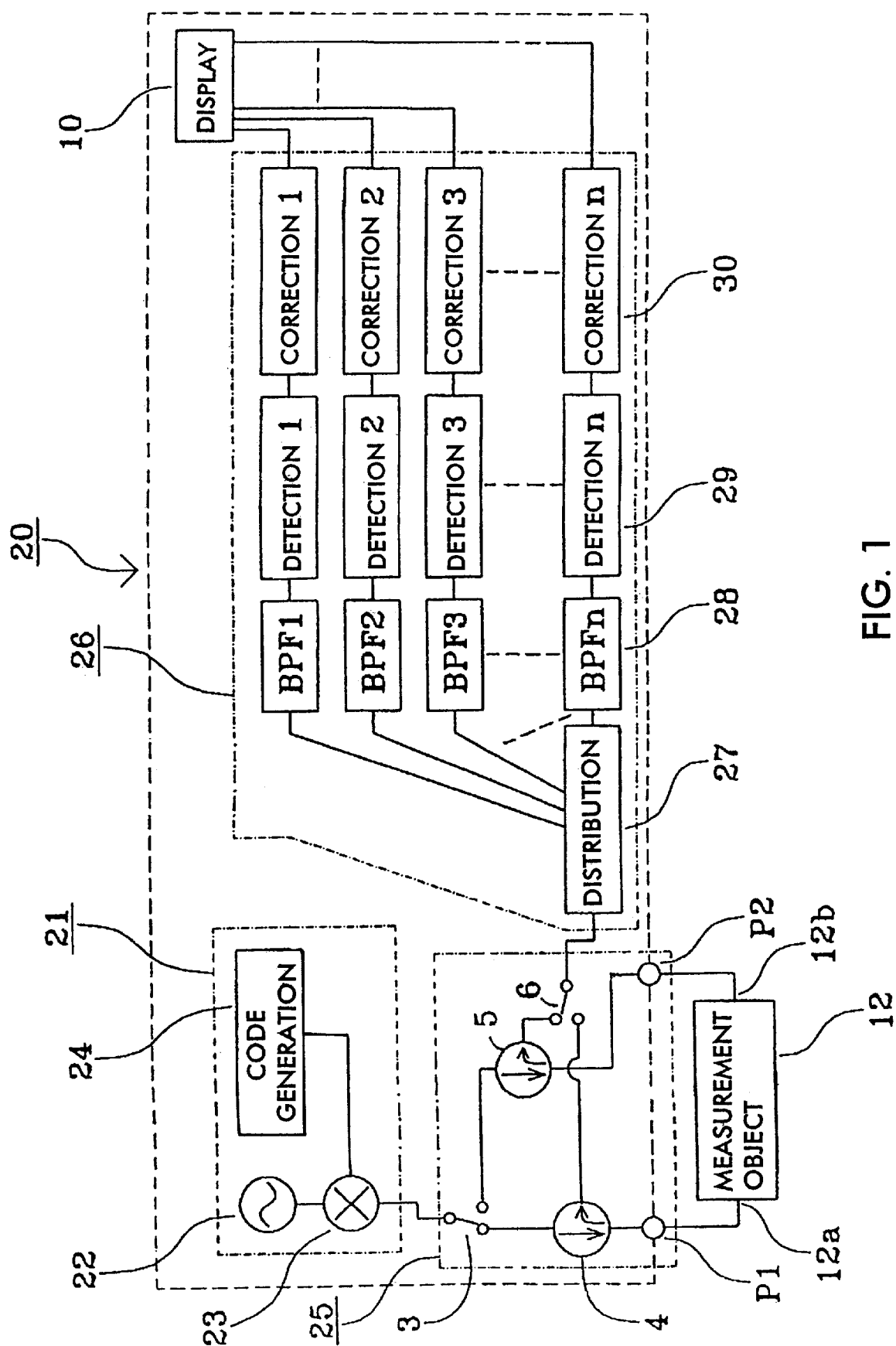
FIG. 1 is a block diagram of an embodiment of a measuring apparatus of the present invention.

In FIG. 1, a measuring apparatus 20 is composed of a multi-carrier generator 21, an output 25, a frequency characteristic measuring apparatus 26, and an indicator 10. The output 25 also functions as an input. In this case, the multi-carrier generator 21 is made up of a signal generator 22 operative to generate a signal having one frequency, a spectrum spreader 23 connected between the signal generator 22 and the output 25, and a spread code generator 24 connected to the spectrum spreader 23. Further, the output 25 is composed of the switches 3 and 6, the circulators 4 and 5, and the signal ports P1 and P2, shown in the conventional measuring apparatus 1 of FIG. 12. Connections between them are the same as those in the measuring apparatus 1. The frequency characteristic measuring apparatus 26 is composed of a one-input n-output signal distributor 27 connected to the output 25, n band-pass filters 28 connected to the respective outputs of the signal distributor 27, n signal detectors 29 connected to the n band-pass filters 28, respectively, and n correctors 30 connected to the n signal detectors 29, respectively. The outputs of the n correctors 30 are connected to the indicator 10, respectively.

In the measuring apparatus 20 configured as described above, first, a spread code (PN code) with a code length of C (no unit) and a chip rate of T (second) is generated by the spread code generator 24 in the multi-carrier generator 21, and thereby, the signal having one frequency output from the signal generator 22 is spread by means of the spectrum spreader 23, so that the multi-carrier signal composed of n signals being orthogonal to each other and having frequencies distant every 1/CT (Hz) from each other is formed.

Figure 2:
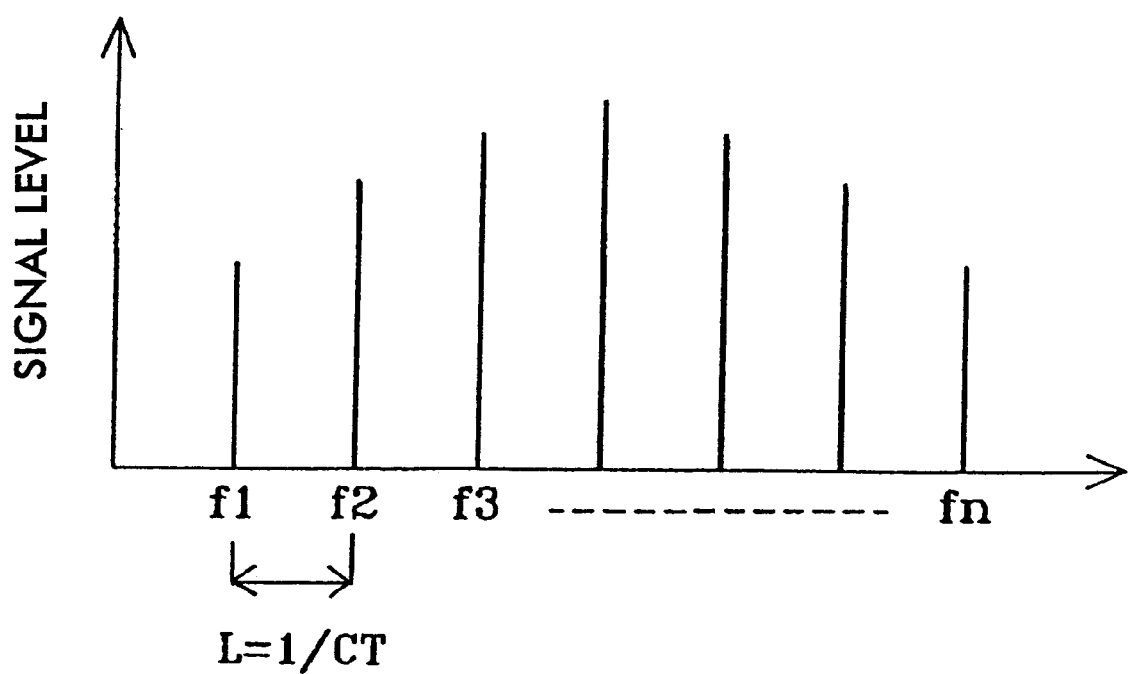
FIG. 2 is a graph illustrating the frequency characteristics of a multi-carrier signal generated by a multi-carrier generator of the measuring apparatus of FIG. 1.

As seen in FIG. 2, the multi-carrier signals are n signals which are distant at frequency intervals of 1/CT (Hz).

Referring to FIG. 1, the multi-carrier signal generated by the multi-carrier generator 21 is output from the measuring apparatus 20 through the signal port P1 of the output 25, and input to the object 12 through the first terminal 12a. The signals having the respective frequencies contained in the multi-carrier signal are orthogonal to each other. Therefore, the signals, not exerting an influence on each other, pass through the object 12, and are output from the second terminal 12b and returned to the measuring apparatus 20 through the signal port P2 of the input 25. The multi-carrier signal returned to the measuring apparatus 20 is input to the frequency characteristic measuring apparatus 26.

The multi-carrier signal input to the frequency characteristic measuring apparatus 26 is separated into the respective frequency components by the distributor 27, and input to the n band-pass filters 28. The n band-pass filters 28 are so adjusted that the respective separated signal components are selectively passed through the filters 28. The signals output from the n band-pass filters 28 are input to the n signal detectors 29, respectively, where the amplitudes and the phases are detected. The detected amplitudes and phases are corrected by the n correctors 30 by use of the calibration values previously determined in the state that the object 12 is absent and the signal ports P1 and P2 are directly connected, and displayed on the indicator 10.

As seen in the above description, in the measuring apparatus 20, by use of the multi-carrier signal composed of plural signals orthogonal to each other and having plural different frequencies, the characteristics at the plural frequencies of the object 12 can be measured at the same time. Since the respective signals constituting the multi-carrier signal are orthogonal to each other, the characteristics for the respective frequencies of the object 12 can be accurately measured while the signals having the different frequencies are not influenced with each other in the object 12. In addition, the non-linear characteristic of the object given when the plural signals are input at the same time can be measured by comparing the characteristics with those measured by a conventional single carrier measuring apparatus. Thus, the circuit diagnosis of the object becomes possible. Further, the sweep signal generator is unnecessary, and the cost saving of the measuring apparatus can be realized.

In the above embodiment, described is the configuration by which the pass-characteristics ranging from the first terminal 12a to the second terminal 12b of the object 12 are measured by means of the measuring apparatus 20. However, by combination of the switches 3 and 6 of the input 25, the configuration can be realized by which the pass-characteristics (S12) ranging from the second terminal 12b thereof to the first terminal 12a of the object 12, or the reflection characteristics (S11 and S22) in the first terminal 12a and the second terminal 12b of the object 12 are measured.

Figure 3:
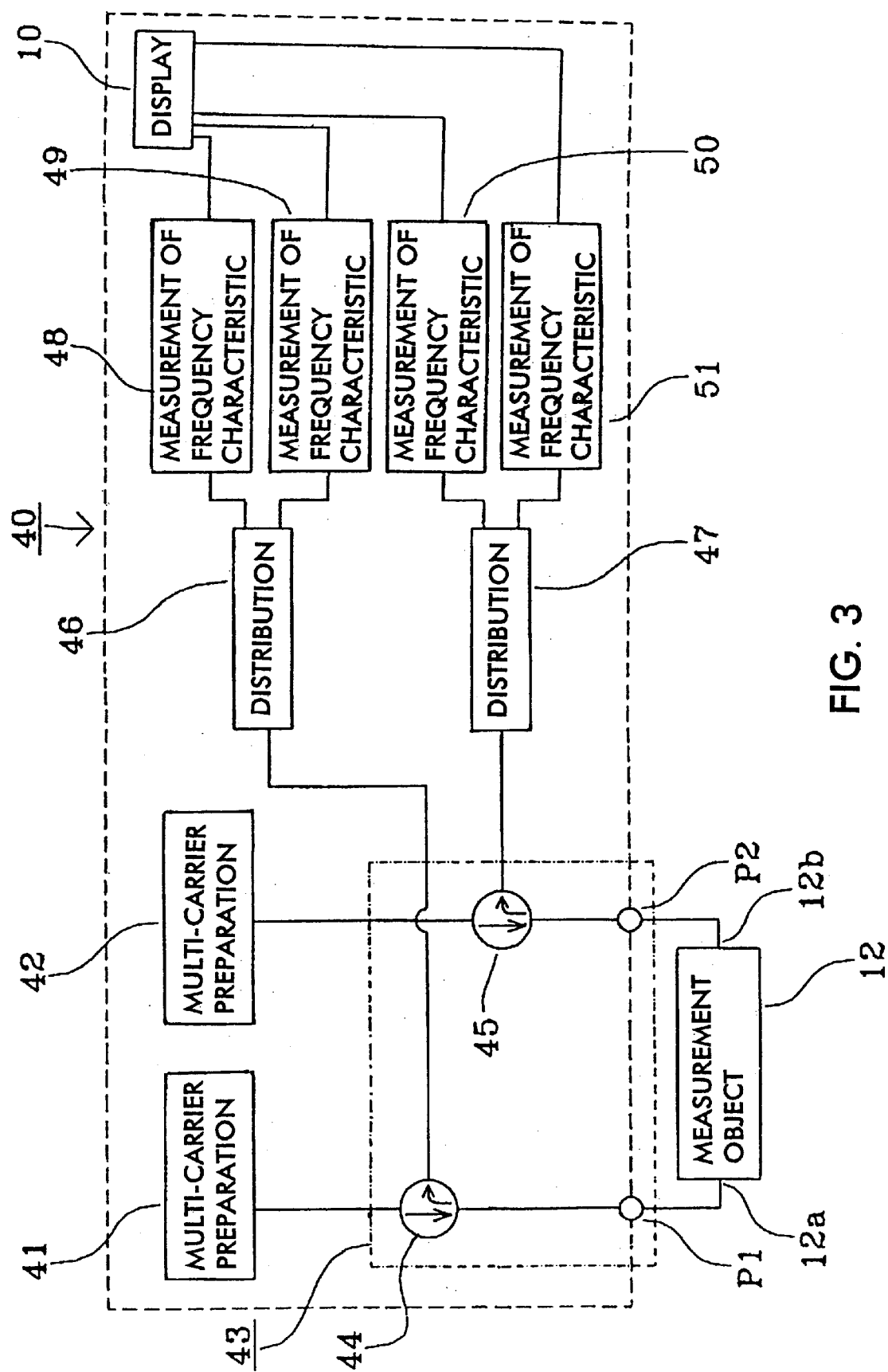
FIG. 3 is a block diagram of another embodiment of the measuring apparatus of the present invention.

In FIG. 3, a measuring apparatus 40 is composed of two multi-carrier generators 41 and 42, an output 43, two one input two-output signal distributors 46 and 47, four frequency characteristic measuring apparatuses 48, 49, 50, and 51, and an indicator 10. The multi-carrier generators 41 and 42 are connected to the output 43, respectively. The output 43 is composed of two circulators 44 and 45, and the signal ports P1 and P2. The circulators 44 is connected between the multi-carrier generators 41 and the signal port P1. The circulators 45 is connected between the multi-carrier generators 42 and the signal port P2. The circulators 44 and 45 are connected to the signal distributors 46 and 47, respectively. Two outputs of the signal distributor 46 are connected to frequency characteristic measuring apparatuses 48 and 49, and two outputs of the signal distributor 47 to frequency characteristic measuring apparatuses 50 and 51, respectively. Further, the outputs of the frequency characteristic measuring apparatuses 48, 49, 50, and 51 are connected to the indicator 10.

In this case, the multi-carrier generators 41 and 42 have substantially the same configuration as the multi-carrier generator 21 of the measuring apparatus 20 shown in FIG. 1. Further, the frequency characteristic measuring apparatuses 48, 49, 50, and 51 have substantially the same configuration as the frequency characteristic measuring apparatus 26 of the measuring apparatus 20 shown in FIG. 1. Accordingly, their detailed description will be omitted. Further, an output 45 also functions as an input.

In the measuring apparatus 40 configured as described above, the multi-carrier generators 41 and 42 generates two multi-carrier signals which are orthogonal to each other.

The multi-carrier signal generated by the multi-carrier generator 41, passed through the circulator 44, are output from the measuring apparatus 40 through the signal port P1, and input to the object 12 through the first terminal 12a. The signals having the respective frequencies constituting the multi-carrier signal are passed through the object 12, not exerting an influence on each other, since they are orthogonal to each other, output through the second terminal 12b, and returned to the measuring apparatus 40 through the signal port P2 of the input 43. The multi-carrier signal returned to the measuring apparatus 40 is input to the signal distributor 47 through the circulator 45. On the other hand, the multi-carrier signal reflected on the first terminal 12a of the object 12 is returned to the measuring apparatus 40 through the signal port P1, and input to the signal distributors 46 through the circulators 44.

The multi-carrier signal generated by the multi-carrier generators 42, passed through the circulator 45, is output from the measuring apparatus 40 through the signal port P2, and input through the second terminal 12b to the object 12. The signals having the respective frequencies constituting the multi-carrier signal are passed through the object 12, not interfering each other, since they are perpendicular to each other, and output through the first terminal 12a, and returned to the measuring apparatus 40 through the signal port P1 of the input 43. The multi-carrier signal returned to the measuring apparatus 40 is input to the signal distributor 46 through the circulator 44. On the other hand, the multi-carrier signal reflected on the second terminal 12b of the object 12 are input to the signal distributor 47 through the circulators 45.

As a result, the multi-carrier signal generated by the multi-carrier generators 41 and reflected on the first terminal 12a of the object 12, and the multi-carrier signal generated by the multi-carrier generators 42 and passed through the object 12, going through the second terminal 12b and then the first terminal 12a, are input to the signal distributor 46. The multi-carrier signal generated by the multi-carrier generator 42 and reflected on the second terminal 12b of the object 12, and the multi-carrier signals generated by the multi-carrier generator 41 and passed through the object 12, going through the first terminal 12a and then the second terminal 12b, are input to the signal distributor 47.

The signals including the two multi-carrier signals input to the signal distributor 46 are distributed into two parts and input to the frequency characteristic measuring apparatuses 48 and 49. Further, the signals including the two multi-carrier signals input to the signal distributor 47 are distributed into two parts and input to the frequency characteristic measuring apparatuses 50 and 51. In this case, the frequency characteristic measuring apparatuses 48 and 50 are so set as to detect the signals in the state that they are opposite to the multi-carrier signal generated by the multi-carrier generator 41. The frequency characteristic measuring apparatuses 49 and 51 are so set as to detect the signals in the state that they are opposite to the multi-carrier signal generated by the multi-carrier generators 42. Therefore, in the frequency characteristic measuring apparatuses 48, the reflection characteristic (S11) of the object 12 is measured by use of the multi-carrier signal generated by the multi-carrier generators 41 and reflected on the first terminal 12a of the object 12. Further, in the frequency characteristic measuring apparatuses 49, the pass-characteristic (S12) of the object 12 is measured by use of the multi-carrier signal generated by the multi-carrier generator 42 and passed through the second terminal 12b of the object 12 and then the first terminal 12a. In addition, in the frequency characteristic measuring apparatuses 50, the pass-characteristic (S21) of the object 12 is measured by use of the multi-carrier signal generated by the multi-carrier generators 41 and passed through the first terminal 12a of the object 12 and then the second terminal 12b. Moreover, in the frequency characteristic measuring apparatuses 51, the reflection characteristic (S22) of the object 12 is measured by use of the multi-carrier signal generated by the multi-carrier generator 42 and reflected on the second terminal 12b of the object 12.

As described above, in the measuring apparatus 40, all the pass-characteristics and the reflection characteristics of one measurement object can be measured at the same time by use of the plural multi-carrier signals.

In the above embodiment, described is the configuration by which the object 12 having the two terminals is measured with the measuring apparatus 40 having the two signal ports. However, even if the object has at least three terminals, its characteristics can be measured in the same manner by preparing a required number of the signal ports, the multi-carrier generators, and the frequency characteristic measuring apparatuses, respectively.

Figure 4:
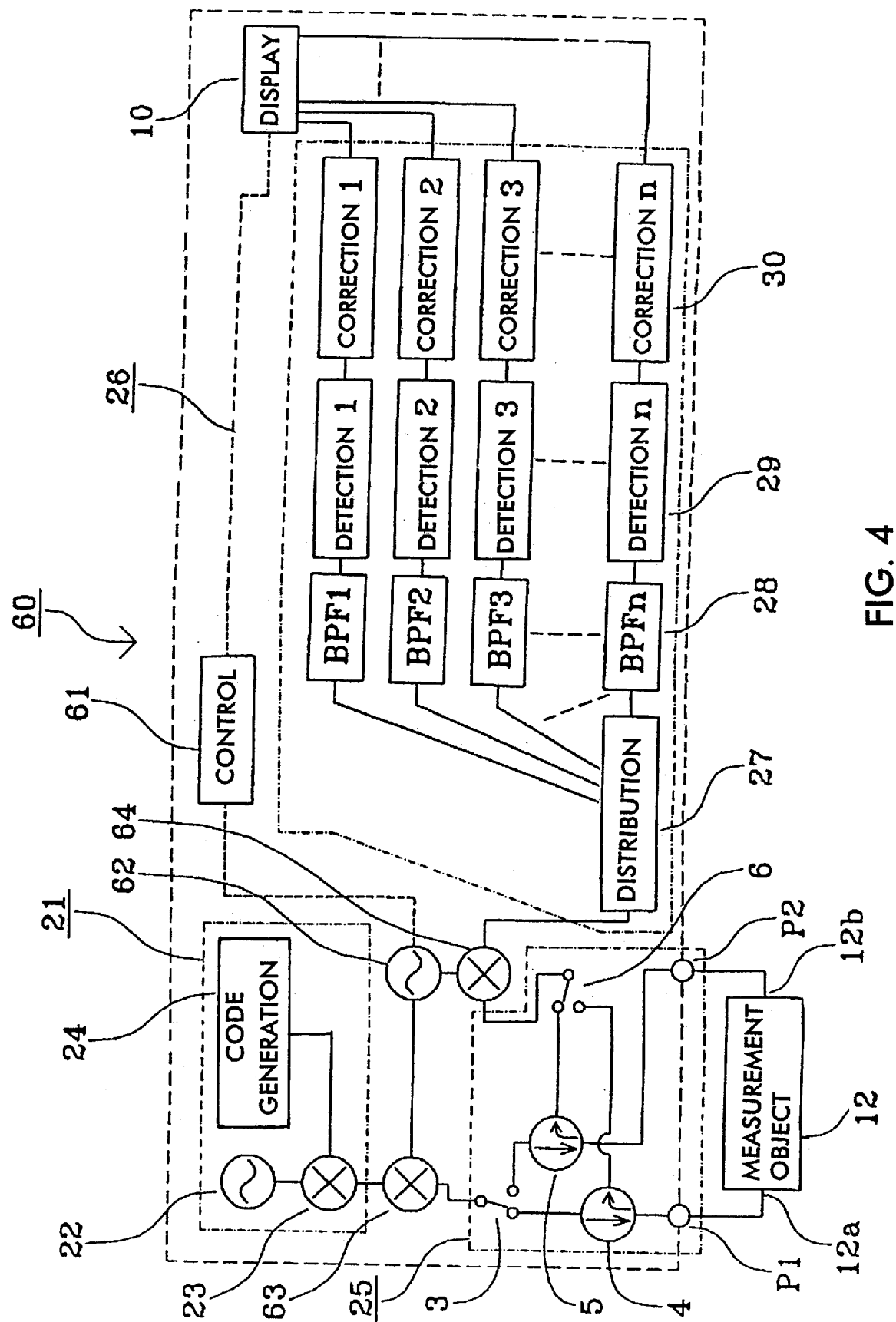
FIG. 4 is a block diagram of a further embodiment of the measuring apparatus of the present invention.

In FIG. 4, a measuring apparatus 60 is configured by addition of a control circuit 61, a sweep signal generator 62, and mixers 63 and 64 to the measuring apparatus 20 of FIG. 1. In this case, the mixer 63 is connected between the spectrum spreader 23 of the multi-carrier generator 21 and the switch 3 of the output 25. The mixer 64 is connected between the switch 6 of the output 25 and the signal distributor 27 of the frequency characteristic measuring apparatus 26. The sweep signal generator 62 is connected to both the mixers 63 and 64. The control circuit 61 is connected to the sweep signal generator 62 and the indicator 10.

In the measuring apparatus 60 configured as described above, to the multi-carrier signal generated by the multi-carrier generator 21, a signal from the sweep signal generator 62 is applied in the mixer 63, so that the multi-carrier signal is frequency-converted, and then, input to the object 12 through the output 25. The multi-carrier signal passed through or reflected on the object 12 is input to the mixer 64 through the input 25. In the mixer 64, to the multi-carrier signal, a signal from the sweep signal generator 62 is applied, so that the multi-carrier signal is frequency-converted to have the original frequencies, and then, input to the frequency characteristic measuring apparatus 26. Moreover, since the sweep signal generator 62 sweeps its oscillation frequency in a predetermined frequency range, according to the control by the controlling circuit 61, the frequencies of the multi-carrier signal input to the object 12 are also swept. The indicator 10 displays the results detected by the frequency characteristic measuring apparatus 26 with the frequencies being swept, according to the control circuit 61.

As described above, in the measuring apparatus 60, the multi-carrier signal generated by the multi-carrier generator 21, after they are frequency-converted, are swept in a predetermined frequency range. Accordingly, the frequency characteristics of the object can be measured in a wider frequency range or at more frequency points as compared with the measurement with the measuring apparatus 20 shown in FIG. 1.

In the above embodiment, after the multi-carrier signal is generated and frequency-converted, the sweeping of the frequencies is carried out. However, even if the sweep signal generator 62 and the mixers 63 and 64 are not provided, similar operation and effects can be presented, for example, by such a measuring apparatus that the signal generator 22 itself is connected, as the sweep signal generator, to the controlling circuit 61, as shown in the conventional measuring apparatus 1 of FIG. 12, so that the respective pass-bands of the n band-pass filters 28 of the frequency characteristic measuring apparatus 26 can be changed in correspondence to a change in the oscillation frequency of the signal generator 22.

The multi-carrier generator is not limited to the system which employs the spread spectrum as in the measuring apparatus 20 of FIG. 1, but a system different from the above-described one may be available.

Figure 5:
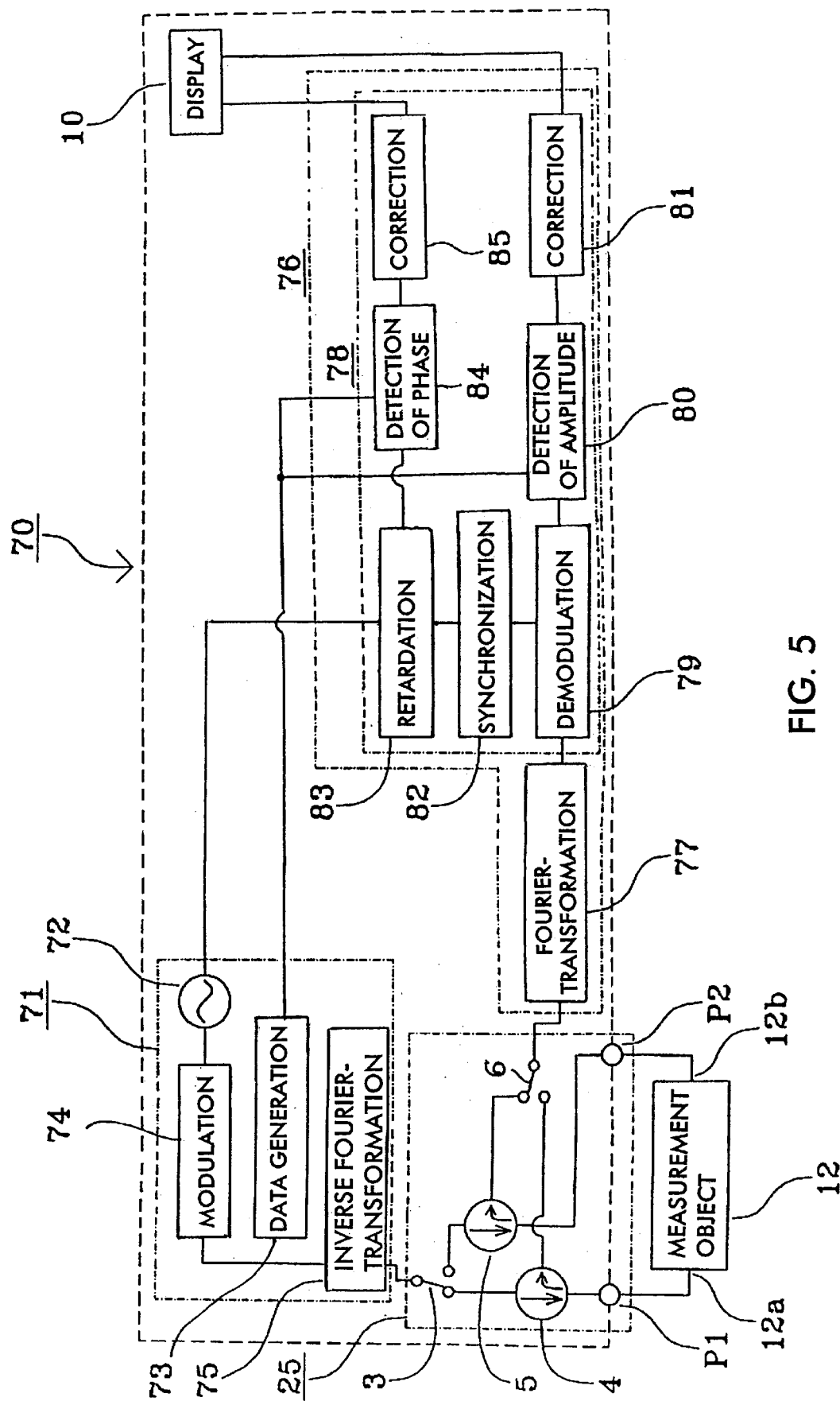
FIG. 5 is a block diagram of a still further embodiment of the measuring apparatus of the present invention.

In FIG. 5, a measuring apparatus 70 is composed of a multi-carrier generator 71, the output 25, and a frequency characteristic measuring apparatus 76, and the indicator 10. The output 25 also functions as an input. The multi-carrier generator 71 is made up of a signal generator 72, a data generator 73, a modulator 74 connected to the signal generator 72 and the data generator 73, respectively, and an inverse Fourier-transformer 75, which is a time—frequency converter, connected between the modulator 74 and the switch 3 of the output 25. Further, the frequency characteristic measuring apparatus 76 is composed of a Fourier converter 77, which is a frequency—time converter, connected to the switch 6 of the output 25, and a signal detector 78 connected to the Fourier converter 77. Further, the signal detector 78 is made up of a demodulator 79 connected to the Fourier converter 77, an amplitude detector 80 and an amplitude corrector 81 connected to the demodulator 79 in that order, a synchronizing circuit 82 connected to the demodulator 79, a retarding circuit 83 connected to the synchronizing circuit 82, and a phase detector 84 and a phase corrector 85 connected to the retarding circuit 83 in that order. The retarding circuit 83 is connected to the signal generator 72 of the multi-carrier generator 71. The amplitude detector 80 and the phase detector 84 are connected to the data generator 73 of the multi-carrier generator 71. Further, the output of the amplitude corrector 81 and that of the phase corrector 85 are connected to the indicator 10.

Figure 6:
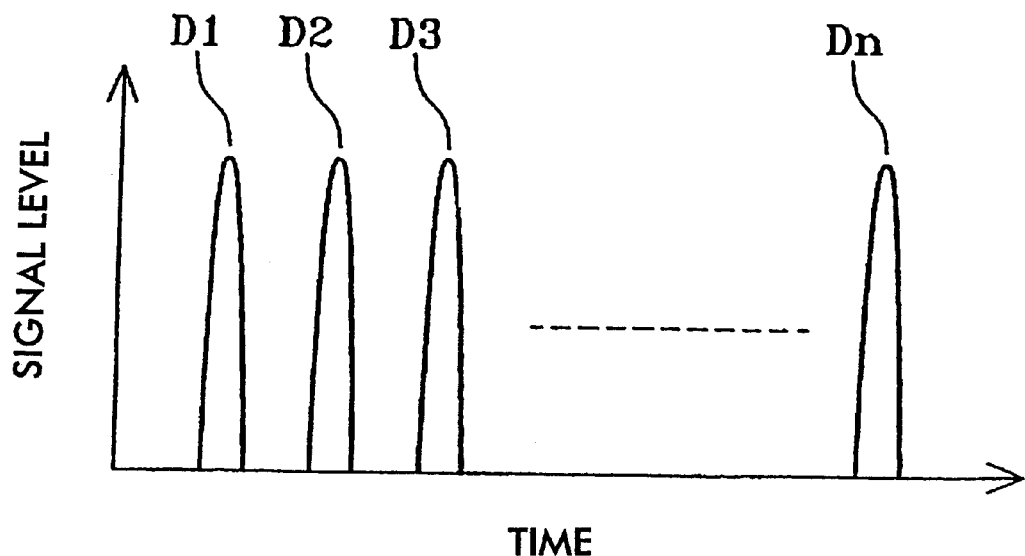
FIG. 6 is a graph illustrating the time-dependent change of a signal modulated primarily by a modulator of the measuring apparatus of FIG. 5.

In the measuring apparatus 70 configured as described above, first, in the multi-carrier generator 71, a predetermined datum composed of plural partial data is output from the data generator 73. The modulator 74 modulates primarily a signal output from the signal generator 72 with the data output from the data generator 73. As the primary conversion system, any one of amplitude modulation (AM, ASK), frequency modulation (FM, FSK), phase modulation (FM, FSK), and the like may be available. In this stage, the signal modulated primarily becomes a signal changing time-dependently in correspondence to the partial data constituting the predetermined datum. FIG. 6 shows time-dependent changes of the signal modulated primarily with the modulator 74. As shown in FIG. 6, the signal modulated primarily is changed time-dependently in correspondence to the partial data D1, D2, D3, . . . , Dn which constitute the datum.

Figure 7:
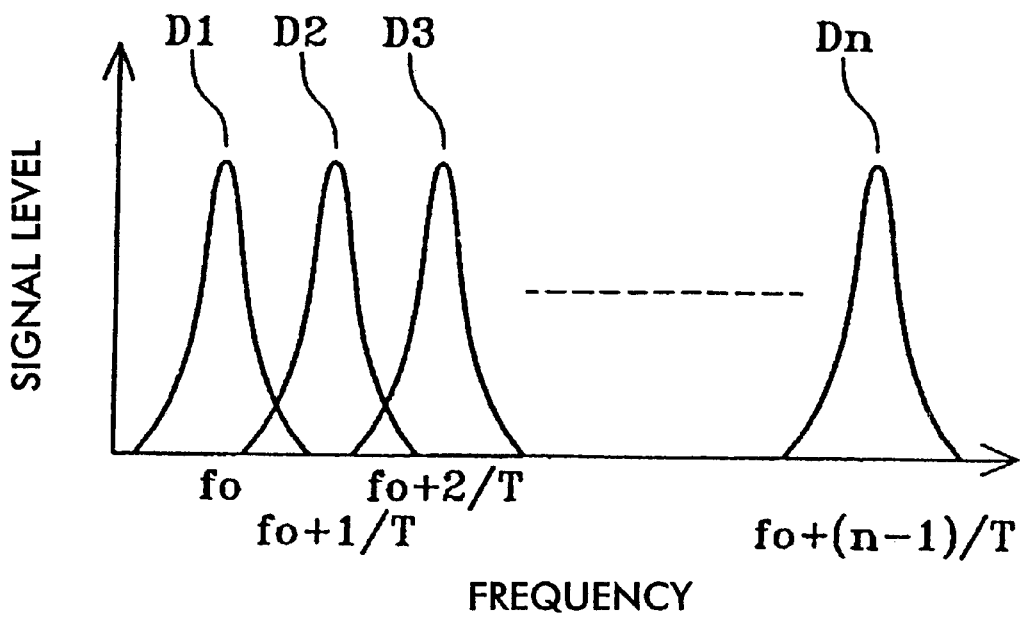
FIG. 7 is a graph illustrating the frequency characteristic of the multi-carrier signal time—frequency converted by an inverse Fourier-transformer of the measuring apparatus of FIG. 5.

Referring to FIG. 5, the datum modulated primarily is time-frequency converted by means of the inverse Fourier-transformer 75 to be a multi-carrier signal composed of signals having plural frequencies which are orthogonal to each other. In this case, the signals having the respective frequencies which constitute the multi-carrier signal are modulated in correspondence to the partial data constituting the predetermined datum, respectively. FIG. 7 shows the frequency characteristic of the multi-carrier signal formed by the inverse Fourier-transformer 75. As seen in FIG. 7, the multi-carrier signal is composed of plural signals corresponding to the partial data at the respective frequencies.

Figure 8:
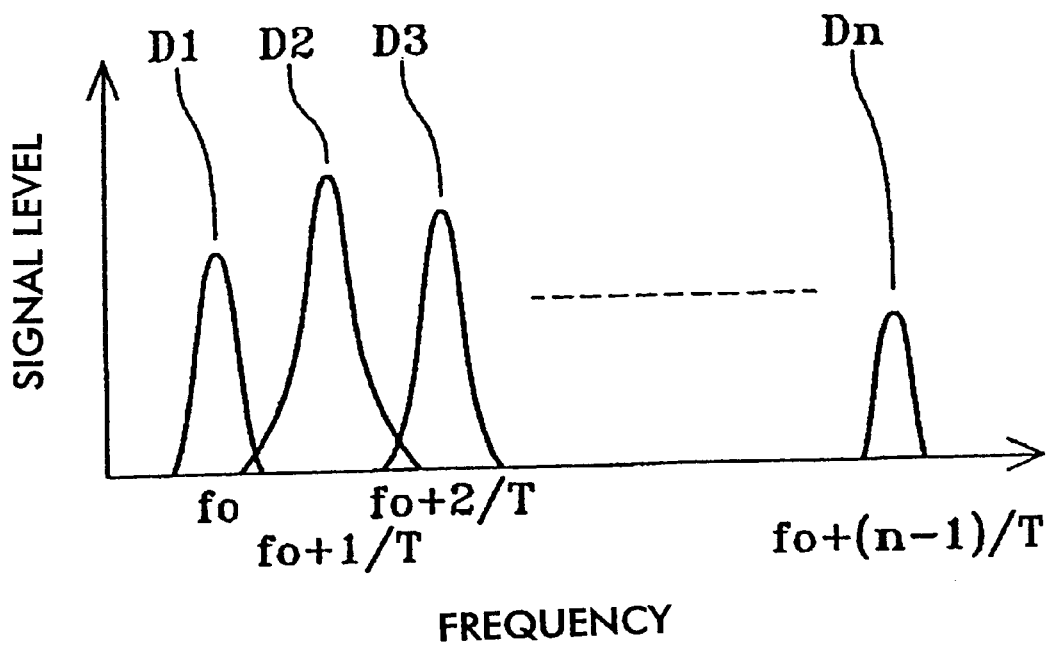
FIG. 8 is a graph illustrating the frequency characteristic of the multi-carrier signal before the signal is frequency—time converted by a Fourier transformer of the measuring apparatus of FIG. 5.

Referring to FIG. 5, the multi-carrier signal is passed through the object 12, going through the first terminal 12a and then the second terminal 12b thereof, and input to the frequency characteristic measuring apparatus 76 through the output 25 which also functions as the input. FIG. 8 shows the frequency characteristic of the multi-carrier signal to be input to the frequency characteristic measuring apparatus 76. As seen in FIG. 8, the multi-carrier signal suffers changes in the amplitude every frequency.

Figure 9:
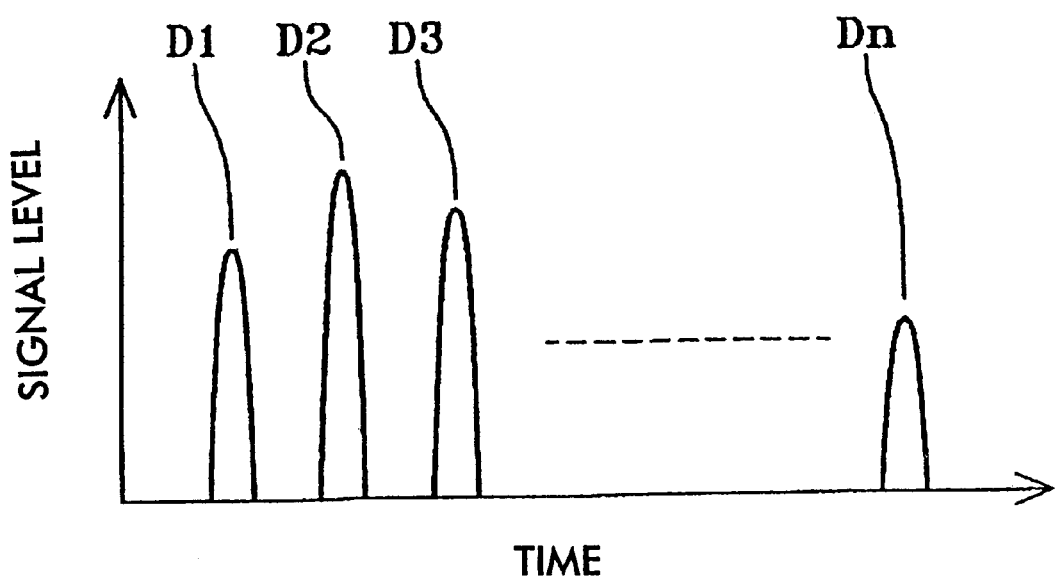
FIG. 9 is a graph illustrating the time-dependent change of the signal frequency—time converted by the Fourier transformer of the measuring apparatus of FIG. 5.

Referring to FIG. 5, in the frequency characteristic measuring apparatus 76, the input multi-carrier signal is input to the Fourier converter 77 which is a frequency—time converter, where it is frequency—time converted, and input to the signal detector 78. FIG. 9 shows the time-dependent change of the signal after it is frequency—time converted by the Fourier converter 77. As seen in FIG. 9, given is the signal of which the amplitude changes time-dependently every partial datum.

Referring to FIG. 5, in the signal detector 78, the input signal is input to the demodulator 79. The demodulator 79 is connected to the signal generator 72 through the synchronizing circuit 82 and the retarding circuit 83, and carries out the synchronous detection by means of the signal used for the primary modulation. The retardation amount in-the synchronous detection of the signal from the signal generator 72 is detected by the retarding circuit 83, and moreover, in the phase detector 84, compared with the predetermined datum output from the data generator 73, so that the phase retardation amounts for the respective partial data of the signal, that is, the phase retardation amount of the multi-carrier signal every frequency is detected. The detected phase retardation amounts are corrected by the phase corrector 85 by use of calibration values previously determined in the state that the object 12 is absent, and the signal ports P1 and P2 are directly connected, and displayed on the indicator 10.

On the other hand, the datum modulated primarily by the demodulator 79 is compared with the predetermined datum output from the data generator 73, by the amplitude detector 80, and thereby, the change amounts in amplitude for the respective partial data contained in the datum, that is, the change amounts in amplitude for the respective frequencies of the multi-carrier signal are detected. The detected amplitude change amounts are corrected by the amplitude corrector 81 by use of calibration values previously determined in the state that the object 12 is absent, and the signal ports P1 and P2 are directly connected, and displayed on the indicator 10.

As described above, in the measuring apparatus 70, with the multi-carrier signal composed of plural signals having different frequencies and being orthogonal to each other, the characteristics at the plural frequencies of the object can be measured at the same time. Further, since the respective signals constituting the multi-carrier signal are orthogonal to each other, the signals exert no influences on each other in the object 12 so that the characteristics can be accurately measured for the respective frequencies. In addition, it becomes unnecessary to provide the band-pass filters, the signal detectors, and the correctors of which the numbers are equal to frequency points, respectively, as in the measuring apparatus 20 of FIG. 1. Thus, the cost saving can be realized.

In the above embodiment, described is the configuration of the measuring apparatus 70 by which the pass-characteristics ranging from the first terminal 12a to the second terminal 12b of the object 12 are measured. However, by combination of the switches 3 and 6 of the output 25, the configuration becomes available by which the pass-characteristics (S12) of the object 12 ranging from the second terminal 12b to the first terminal 12a, or the reflection characteristics (S11 and S22) in the first terminal 12a and the second terminal 12b of the object 12 are measured.

Figure 10:
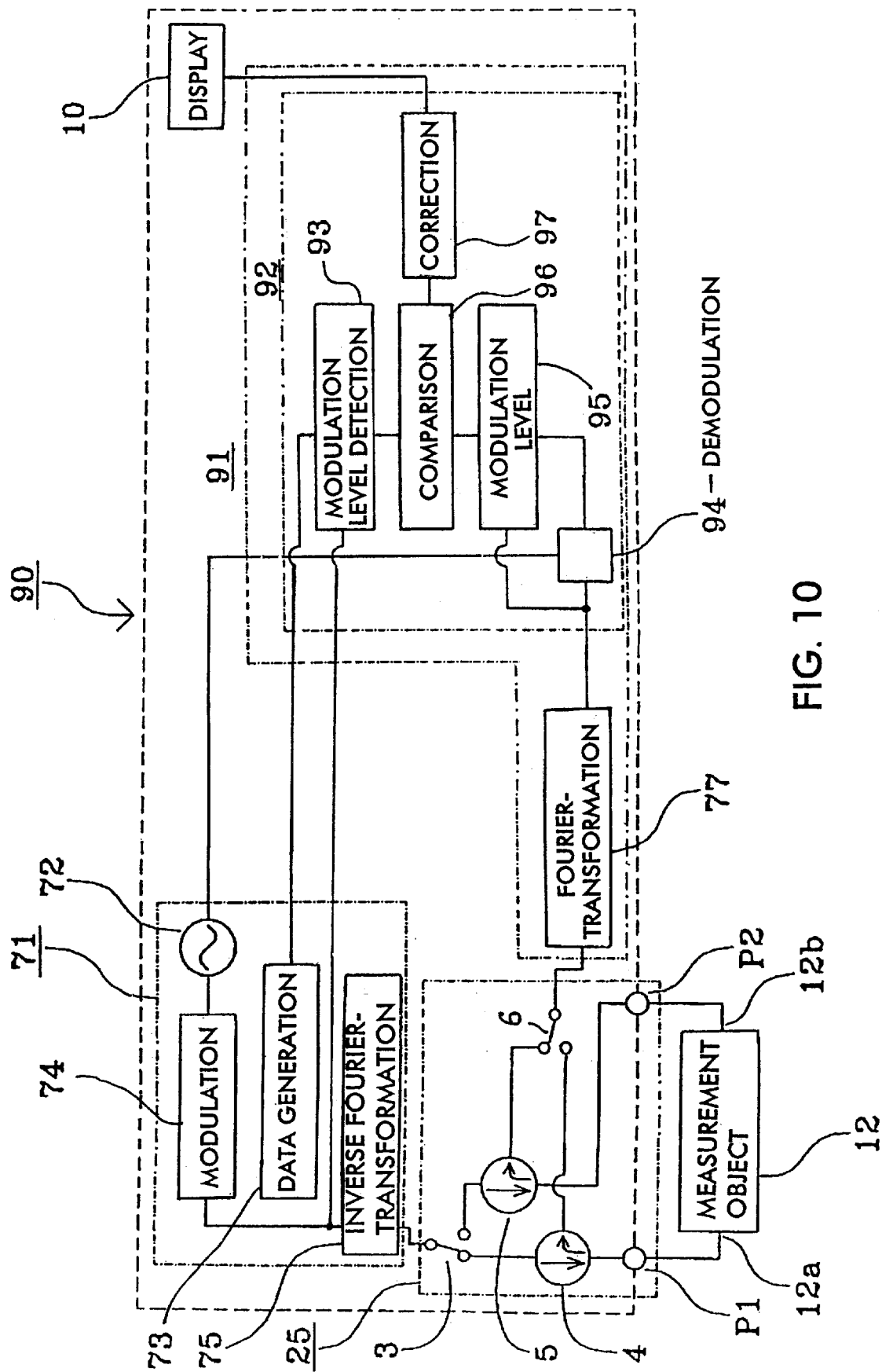
FIG. 10 is a block diagram of another embodiment of the measuring apparatus of the present invention.

In FIG. 10, a measuring apparatus 90 is composed of the multi-carrier generator 71, the output 25, and a frequency characteristic measuring apparatus 91. The frequency characteristic measuring apparatus 91 is made up of the Fourier converter 77 which is a frequency—time converter, and a signal detector 92. The signal detector 92 is composed of a first modulation level detector 93 connected to the data generator 73 of the multi-carrier generator 71 and the modulator 74, a demodulator 94 connected to the Fourier converter 77, a second modulation level detector 95 connected to both the Fourier converter 77 and the demodulator 94, a level comparator 96 connected to the first modulation level detector 93 and the second modulation level detector 95, and an amplitude corrector 97 connected to the level comparator 96. The output of the amplitude corrector 97 is connected to the indicator 10.

In the measuring apparatus 90 configured as described above, the operation of the multi-carrier generator 71 is the same as that of the measuring apparatus 70 shown in FIG. 5, and its description will be omitted.

Further, in the frequency characteristic measuring apparatus 91, first, a predetermined datum output from the data generator 73 and the signal modulated primarily by the modulator 74 are input to the first modulation level detector 93, where, in the signal modulated primarily and before its input to the object 12, the modulation levels for the respective partial data constituting the predetermined datum are preliminarily detected. Further, the multi-carrier signal passed through the object 12, going through the first terminal 12a and then the second terminal 12b, returned to the measuring apparatus 90, and input to the frequency characteristic measuring apparatus 91 is input to the Fourier converter 77 which is a frequency—time converter, where it is frequency—time converted, and input to the signal detector 92. In the signal detector 92, the input signal is input to the demodulator 94 and also to the second modulation level detector 95. In the second modulation level detector 95, detected are the modulation levels of the respective partial data of the signal modulated primarily after it is passed through or reflected on the object 12, by use of the data demodulated by the demodulator 94 and the signal modulated primarily before the signal is demodulated by the demodulator 94. The outputs from the first modulation level detector 93 and those from the second modulation level detector 95 are compared by the level comparator 96, so that the changes in the amplitude of the signal, caused by the fact that the signal is passed through or reflected on the object 12, are detected. The detected amplitude change amounts are corrected by the amplitude corrector 97 by use of calibration values determined previously in the state that the object 12 is absent and the signal ports P1 and P2 are directly connected, and displayed with the indicator 10.

As regards the measuring apparatus 90, described is only the configuration by which the amplitude of the signal passed through or reflected on the object 12 is measured. However, the measurement of the phase is possible by the similar configuration.

As described above, in the measuring apparatus 90, with the multi-carrier signal composed of the plural signals having different frequencies and being orthogonal to each other, the characteristics at plural frequencies of the object can be measured at the same time. Further, since the respective signals constituting the multi-carrier signal are orthogonal to each other, the characteristics for the respective frequencies can be accurately measured while the signals exert no influences on each other in the object 12.

In the above embodiment, described is the configuration of the measuring apparatus 90 by which the pass-characteristics ranging from the first terminal 12a to the second terminal 12b of the object 12 are measured. However, by combination of the switches 3 and 6 of the output 25, the configuration becomes available by which the pass-characteristics (S12) of the object 12 ranging from the second terminal 12b to the first terminal 12a, or the reflection characteristics (S11 and S22) in the first terminal 12a and the second terminal 12b of the object 12 are measured.

Figure 11:
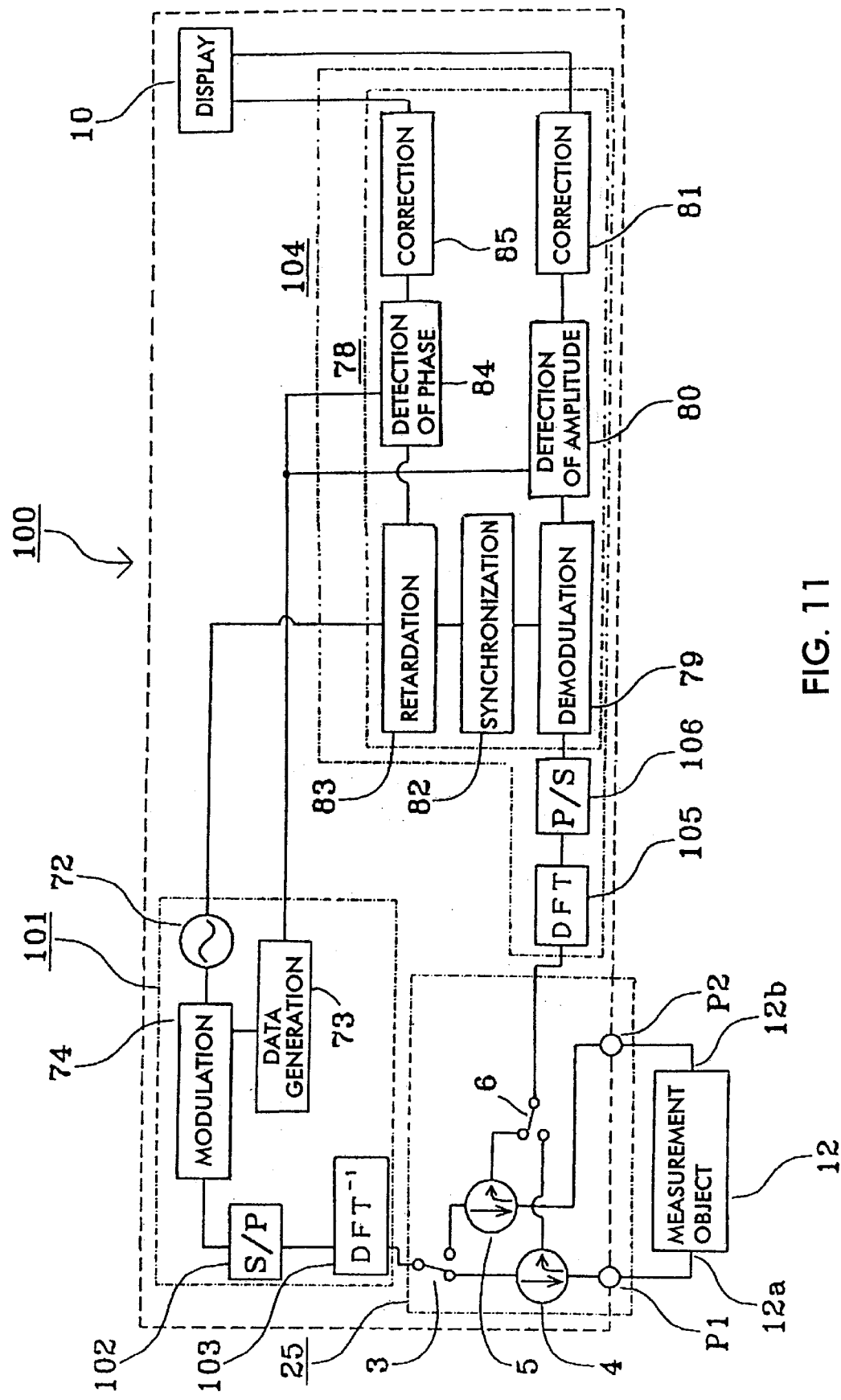
FIG. 11 is a block diagram of a further embodiment of the measuring apparatus of the present invention.

In FIG. 11, in a measuring apparatus 100, a serial—parallel converter 102 and a digital inverse Fourier transformer (DFT$_{-1}$) 103 are connected, in that order, between the modulator 74 and the switch 3. Further, a digital Fourier transformer (DFT) 105 and a parallel—serial converter 106 are connected, in that order, between the switch 6 and the demodulator 79. In this case, the multi-carrier generator 71 is composed of the signal generator 72, the data generator 73, the modulator 74, and the serial—parallel converter 102, and the digital inverse Fourier transformer 103. Further, a frequency characteristic measuring apparatus 104 is composed of the digital Fourier transformer 105, the parallel—serial converter 106, and the signal detector 78.

In the measuring apparatus 100 configured as described above, the serial—parallel converter 102 and the digital inverse Fourier transformer 103 constitute an OFDM converter, and moreover, the digital Fourier transformer 105 and the parallel—serial converter 106 constitute an inverse OFDM converter. They function as a time—frequency converter and a frequency—time converter, like the inverse Fourier-transformer 75 and the Fourier converter 77 of the measuring apparatus 70 shown in FIG. 5, so that the characteristics at plural frequencies of the object can be measured at the same time by use of the multi-carrier signal composed of plural signals having different frequencies and being orthogonal to each other. Particularly, the output levels of the respective signals can be easily controlled to be uniform by use of the output from OFDM as the multi-carrier signal, and the signal processing circuit can be simplified, as compared with the case of the spread spectrum signal used, or the like.

The time—frequency converter and the frequency—time converter are not limited to the inverse Fourier transformer and the Fourier transformer used in the measuring apparatus 70 of FIG. 5 and the measuring apparatus 90 of FIG. 10, or the inverse OFDM converter and the inverse OFDM converter used in the measuring apparatus 100 of FIG. 11. An inverse chirp converter and a chirp converter may be employed, giving similar operation and effects.

Further, the multi-carrier generators 71 and 101 and the frequency characteristic measuring apparatuses 76, 91, and 104 used in the measuring apparatuses 70, 90, and 100 shown in FIGS. 5, 10, and 11, may be employed for the measuring apparatus 40 of FIG. 3 and the measuring apparatus 60 of FIG. 4. All the pass-characteristics and the reflection characteristics of one measurement object can be measured at the same time by use of plural multi-carrier signals. By sweeping the multi-carrier signal in a predetermined frequency range, the frequency characteristics of the object can be measured in a wide frequency range or in more-frequency points.

What is claimed:

1. A measuring apparatus comprising a multi-carrier generator for generating a multi-carrier signal composed of signals having plural frequencies and being orthogonal to each other;

an output for sending the multi-carrier signal to an external object;

an input for receiving the multi-carrier signal output from the object; and a frequency characteristic measuring apparatus for measuring the electrical characteristics at the respective frequencies of the object, based on the received multi-carrier signal.

2. A measuring apparatus according to claim 1, wherein the multi-carrier generator is operative to generate plural multi-carrier signals which are orthogonal to each other.

3. A measuring apparatus according to claim 2, wherein the output has plural ports for transmitting the plural multi-carrier signals to the object in parallel.

4. A measuring apparatus according to claim 2, wherein the input has plural ports for receiving the plural multi-carrier signals output in parallel from the object.

5. A measuring apparatus according to claim 1, wherein the frequency characteristic measuring apparatus is operative to measure plural kinds of characteristics of the object based on the received plural multi-carrier signals.

6. A measuring apparatus according to any one of claims 1 through 5, wherein the multi-carrier generator comprises a signal generator for generating a signal having one frequency, a spread code generator for generating a predetermined spread code, and a spectrum spreader for spreading spectrally the signal generated by the signal generator by use of the spread code generated by the spread code generator, and said frequency characteristic measuring apparatus comprises plural filters corresponding to the frequencies of the respective signals contained in the received multi-carrier signal, and plural signal detectors for measuring the characteristics for the respective signals separated by the plural filters.

7. A measuring apparatus according to any one of claims 1 through 5, wherein the multi-carrier generator comprises a signal generator for generating a signal having one frequency, a data generator for generating a predetermined datum, a modulator for modulating primarily the signal generated by the signal generator with the predetermined datum to form a signal which changes time-dependently in correspondence to the predetermined datum, and a time—frequency converter for converting the modulated signal time-dependently to form a multi-carrier signal composed of signals having plural frequencies, said signals being related principally to the predetermined datum, and said frequency characteristic measuring apparatus comprises a frequency time converter for frequency—time converting the received multi-carrier signal, and a signal detector for detecting the difference between the modulated signal and the frequency—time converted signal, correspondingly to the predetermined datum.

8. A measuring apparatus according to any one of claims 1 through 5, wherein the multi-carrier signal to be input to the object is swept in a predetermined frequency range.

9. A measuring apparatus according to claim 8, wherein the multi-carrier generator comprises a signal generator for generating a signal having one frequency, a spread code generator for generating a predetermined spread code, and a spectrum spreader for spreading spectrally the signal generated by the signal generator by use of the spread code generated by the spread code generator, and said frequency characteristic measuring apparatus comprises plural filters corresponding to the frequencies of the respective signals contained in the received multi-carrier signal, and plural signal detectors for measuring the characteristics for the respective signals separated by the plural filters.

10. A measuring apparatus according to claim 8, wherein the multi-carrier generator comprises a signal generator for generating a signal having one frequency, a data generator for generating a predetermined datum, a modulator for modulating primarily the signal generated by the signal generator with the predetermined datum to form a signal which changes time-dependently in correspondence to the predetermined datum, and a time—frequency converter for converting the modulated signal time-dependently to form a multi-carrier signal composed of signals having plural frequencies, said signals being related principally to the predetermined datum, and said frequency characteristic measuring apparatus comprises a frequency time converter for frequency—time converting the received multi-carrier signal, and a signal detector for detecting the difference between the modulated signal and the frequency—time converted signal, correspondingly to the predetermined datum.

* * * * *